US009735885B1

(12) United States Patent
Sayyah et al.

(10) Patent No.: US 9,735,885 B1
(45) Date of Patent: Aug. 15, 2017

(54) CHIP-SCALE MID-IR SCANNING FREQUENCY MODULATED COHERENT LADAR RECEIVER

(71) Applicant: HRL LABORATORIES, LLC, Malibu, CA (US)

(72) Inventors: Keyvan R. Sayyah, Santa Monica, CA (US); James H. Schaffner, Chatsworth, CA (US); Kevin Geary, Los Angeles, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 14/795,860

(22) Filed: Jul. 9, 2015

(51) Int. Cl.
*H04B 10/61* (2013.01)
(52) U.S. Cl.
CPC .................. *H04B 10/615* (2013.01)
(58) Field of Classification Search
CPC ...... H04B 10/695; H04B 10/69; H04B 10/66; H04B 10/60; H04B 10/6911; H04B 10/615
See application file for complete search history.

(56) References Cited

U.S. PATENT DOCUMENTS

| 4,394,060 A | * | 7/1983 | Verber | G02B 6/12004 |
| | | | | 324/76.36 |
| 5,835,199 A | * | 11/1998 | Phillips | G01S 7/4802 |
| | | | | 356/28.5 |
| 5,852,492 A | * | 12/1998 | Nimblett | G01S 7/51 |
| | | | | 342/179 |
| 8,908,251 B2 | | 12/2014 | Sayyah | |
| 2009/0096545 A1 | | 4/2009 | O'Hara | |
| 2009/0262766 A1 | | 10/2009 | Chen | |
| 2010/0301971 A1 | | 12/2010 | Yonak | |

(Continued)

OTHER PUBLICATIONS

Adany et al., "Chirped Lidar Using Simplified Homodyne Detection" Journal of Lifewave Technology, vol. 27, No. 16, Aug. 15, 2009 p. 3351-3357.

(Continued)

*Primary Examiner* — Ted Wang
(74) *Attorney, Agent, or Firm* — Ladas & Parry

(57) ABSTRACT

A coherent frequency modulated receiver for receiving and detecting arriving optical signals which comprises an electrically controllable optical beam scanner receiving optical input beams arriving at different angles in a field of view of the electrically controllable optical beam scanner, the electrically controllable optical beam scanner conveying a scanned optical input beam as its output optical beam; a grating coupler responsive to the output or reflected optical beam of the electrically controllable optical beams scanner, the grating coupler having a waveguided output; an optical local oscillator laser having a waveguided output; an FMCW signal generator; an optical modulator responsive to the optical waveguided outputs of the optical local oscillator laser and also to an electrical FMCW signal from the FMCW signal generator; a pair of second order non-linear optical elements for frequency upconverting respective outputs of the optical modulator and the grating coupler; and at least one photodiode optically coupled to an outputs of the pair of second order non-linear optical elements.

37 Claims, 9 Drawing Sheets

(56) References Cited

U.S. PATENT DOCUMENTS

2014/0080729 A1* 3/2014 Grego ............... G01N 21/05
506/9
2014/0211298 A1 7/2014 Sayyah et al.
2015/0062691 A1 3/2015 Sayyah

OTHER PUBLICATIONS

McKeag et al., "New Developments in HgCdTe APDs and LADAR Receivers" Proc. SPIE 8012, Infrared Technology Applications XXXVII, 801230 Jun. 20, 2011 p. 801230-1-801230-14.
U.S. Appl. No. 13/754,140 (now published as U.S. Pat. No. 8,908,251 and also published as US 2014/0211298 A1), Notice of Allowance dated Aug. 4, 2014.
Hand, Thomas H., "Design and Applications of Frequency Tunable and Reconfigurable Metamaterials", Department of Electrical and Computer Engineering Duke University, 2009 (208 pages).
MacManamon, Paul F., et al., "Optical Phased Array Technology", Proceedings of the IEEE, vol. 40, No. 2, Feb. 1996, pp. 268-298.
Vasey, F. et al., "Spatial optical beam steering with an AlGaAs integrated phased array", Applied Optics, vol. 32, No. 18 (1993) pp. 3220-3232.
Yu, Jirong, et al., "High Energy Double-pulsed Ho:Tm:YLF Laser Amplifier", NASA Langley Research Center, Laser System Branch, MS 474, Hampton, VA 23681, 2002.
U.S. Appl. No. 14/532,774, Sayyah, filed Nov. 4, 2014.
U.S. Appl. No. 14/532,774 (published as US 2015-0062691 A1), Notice of Allowance dated Jan. 5, 2017.
U.S. Appl. No. 14/532,774 (published as US 2015-0062691 A1), Office Action dated Aug. 8, 2016.
U.S. Appl. No. 14/532,774 (published as US 2015-0062691 A1), Office Action dated Feb. 18, 2016.
U.S. Appl. No. 14/532,774 (published as US 2015-0062691 A1), Office Action dated Nov. 10, 2015.

* cited by examiner

Tunable Beam Scanner

FSS (SRR Array) Unit Cell With
Integrated Si Tunnel Diode Tuning Elements

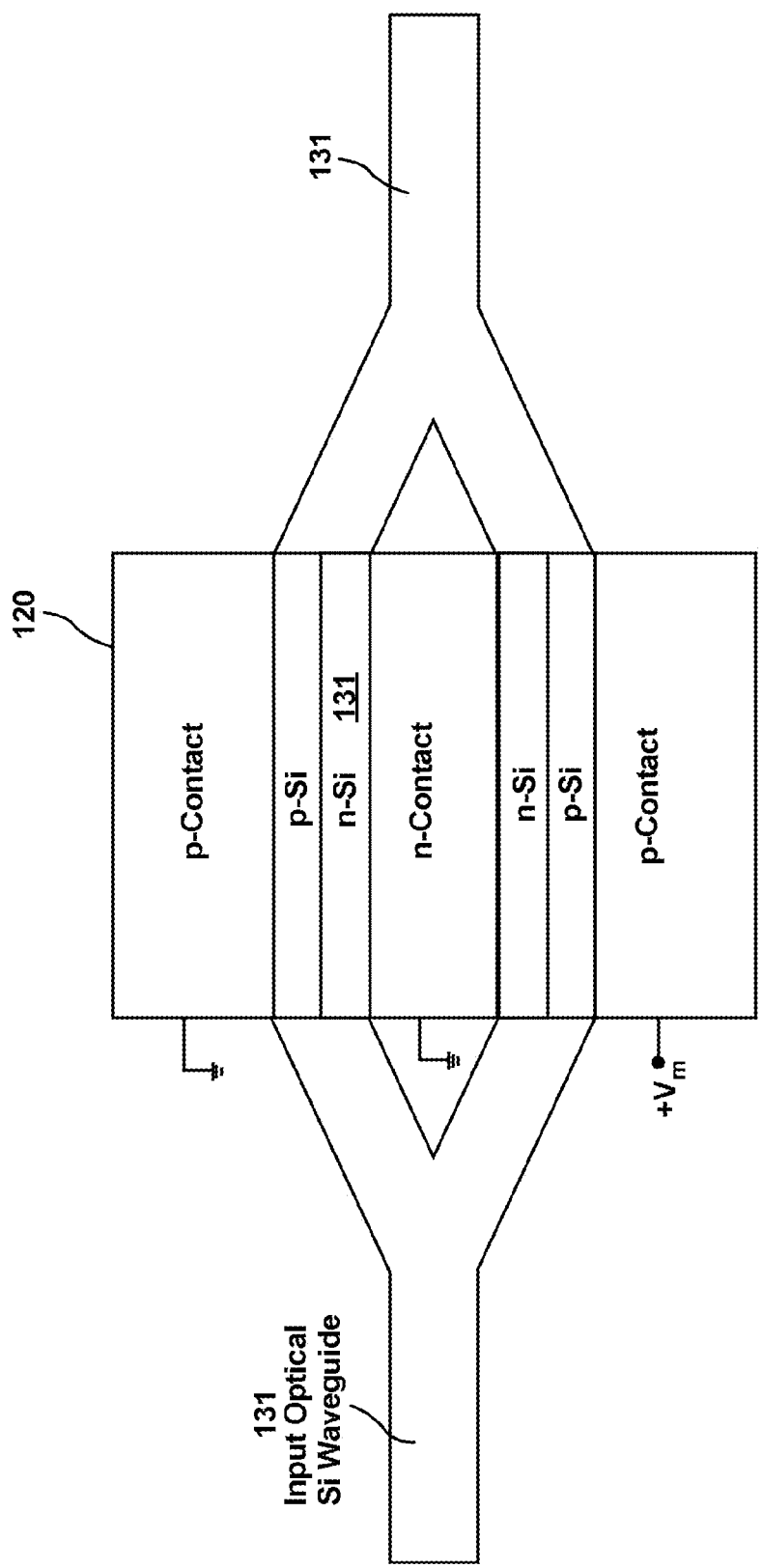

CHIP-SCALE MID-IR SCANNING FREQUENCY MODULATED COHERENT LADAR RECEIVER

CROSS REFERENCE TO RELATED APPLICATIONS

This application is related to U.S. patent application Ser. No. 13/754,140 filed Jan. 30, 2013 and entitled "Tunable Optical Metamaterial", the disclosure of which is hereby incorporated herein by reference.

STATEMENT REGARDING FEDERALLY SPONSORED RESEARCH OR DEVELOPMENT

None.

TECHNICAL FIELD

This invention relates a chip-scale IR (2-12 µm) frequency modulated coherent Laser Radar (LADAR) receiver with beam scanning capability.

BACKGROUND

LADAR imaging technology compared to traditional Radar technology enjoys a higher resolution due to the shorter wavelengths of light compared to RF and therefore is useful in a number of applications, which include precision target selection, automatic target recognition, agile laser designators, imaging IR seeker illuminators, 3D imaging for small unmanned airborne systems (UAS), vehicle adaptive cruise control systems, autonomous navigation systems, and speed and hazard detection for vehicle collision avoidance systems. The chip-scale scanning and coherent IR LADAR receiver concept disclosed herein has advantages of a higher Signal to Noise Ratio (SNR) due to its scanning and coherent detection capabilities. Also, because of lower atmospheric losses in the IR (and more particularly at longer IR wavelengths), the receiver SNR improves further. The ability to operate at room temperatures means that no external cooling of the components is necessary, resulting in a lower cost of manufacturing. A the chip scale size results in lower costs, a smaller size and lower power requirements compared to conventional LADAR technologies.

There is no prior art concerning a chip-scale IR frequency modulated LADAR receiver that the inventors are presently aware. However, there is prior art in the area of mid-IR coherent Doppler LADAR and near-IR coherent frequency modulator continuous wave (FMCW) LADAR which the presently disclosed concept significantly improves upon as explained above. None of this art Frequency-modulated continuous-wave LADAR (FMCW)—also called continuous-wave frequency-modulated (CWFM) LADAR—is a short-range measuring radar set capable of determining distance. This increases reliability by providing distance measurement along with speed measurement, which is important when there is more than one source of reflection arriving at the radar's antenna. This kind of LADAR could be used as "LADAR altimeter" to measure the exact height during the landing procedure of aircraft, for example.

A state-of-the-art mid-IR coherent LADAR receiver, which was developed by NASA Langley Research Center, operates at a wavelength of 2 µm and is based on an optical fiber system with discrete components. See, "High Energy Double-pulsed Ho:Tm:YLF Laser Amplifier", Jirong Yu, NASA Langley Research Center, Laser System Branch, MS 474, Hampton, Va. 23681. It uses a bulky solid-state Ho:Tm:YLF laser as the local oscillator, and dual-balanced InGaAs photodiodes for optical detection. The limitations of this LADAR receiver system are: (1) fixed wavelength operation determined by the solid-state laser material, (2) bulky, heavy, high power consuming and expensive system, (3) the use of discrete cascaded optical components results in higher overall noise and loss, (4) limitation in the wavelength of mid-IR detected signal to $\lambda<2.5$ µm due to use of InGaAs photodiodes, and (4) use of high detectivity mid-IR photodetectors for wavelengths longer than 3 µm would require cooling.

The proposed chip-scale mid-IR coherent LADAR receiver concept disclosed herein has orders of magnitude lower size, weight and power (SWAP), has lower noise, is wavelength selectable in the long to mid-IR portions of the IR spectrum (and preferably from 2-12 µm) and can be monolithically integrated with room temperature highly sensitive Si avalanche photodiodes, as well as with CMOS electronics for post processing of the detected IR signal.

There is also prior art in a non-coherent, direct detection mid-IR LADAR operating at 3.4-3.5 µm wavelengths. This LADAR system is also optical fiber based and uses an interband cascade laser as the optical source and a TE-cooled HgCdTe photodetector in its receiver. See, "New Developments in HgCdTe APDs and LADAR Receivers", Proc. SPIE 8012, Infrared Technology and Applications XXXVII, 801230 (Jun. 20, 2011).

Finally, there is also prior art in a near-IR coherent FMCW LADAR operating at 13 µm wavelength. This LADAR system is also optical fiber based and uses a diode-pumped Nd:YAG laser as the optical source and balanced InGaAs photodetectors for the detection of the received LADAR signal. See, for example, "Chirped Lidar Using Simplified Homodyne Detection", Journal of Lightwave Technology, Vol. 27, p. 3351, 2009.

In summary, the state-of-the-art IR LADAR transceivers are based on bulky modules that use discrete cascaded components which result in higher noise and optical loss, required cooling for improved photodetector performance at longer IR wavelengths and do not have electronic scanning capability.

BRIEF DESCRIPTION OF THE INVENTION

In one aspect the present invention provides a coherent frequency modulated receiver for receiving and detecting arriving optical signals which comprises an electrically controllable optical beam scanner receiving optical input beams arriving at different angles in a field of view of said electrically controllable optical beam scanner, said electrically controllable optical beam scanner conveying a scanned optical input beam as its an output or reflected optical beam; a grating coupler responsive to the output or reflected optical beam of said electrically controllable optical beams scanner, said grating coupler having a waveguided output; an optical local oscillator laser having a waveguided output; a FMCW signal generator; an optical modulator responsive to the optical waveguided outputs of the optical local oscillator laser and also to an electrical FMCW signal from the FMCW signal generator; a pair of second order non-linear optical elements for frequency upconverting respective outputs of the optical modulator and the grating coupler; and at least one photodiode optically coupled to an outputs of said pair of second order non-linear optical elements.

BRIEF DESCRIPTION OF THE DRAWINGS

FIG. 3e depicts an optional design for the modulator in which utilizes two Si based IR optical waveguides, in which the phase of one of the waveguiding arms is modulated via a carrier-injection mechanism.

DETAILED DESCRIPTION

The chip-scale IR coherent LADAR receiver concept disclosed herein has potential advantages of: (1) electronically controlled beam scanning capability which results in enhanced receiver efficiency as well as provides the angle of arrival information, (2) capability of using frequency modulated LADAR signals for optimum receiver operation, (3) operation at room temperature due to optical frequency upconversion of an incoming IR signal, and/or (4) high signal-to-noise ratio (SNR) as a result of coherent detection and use of near-IR photodetectors. The possibility of room temperature operation of the disclosed IR LADAR receiver eliminates the complexity and cost associated with cooling devices to near cryogenic temperatures (<80° K) which would otherwise be required for optimum operation. Furthermore, the coherent detection capability of the disclosed device allows the detection of weak IR LADAR return signals as a result of the gain associated with the disclosed detection scheme. Finally, the compact nature of this potentially chip-scale device can result in a smaller size, weight and lower power compared with using traditional technologies.

Figure 1A:
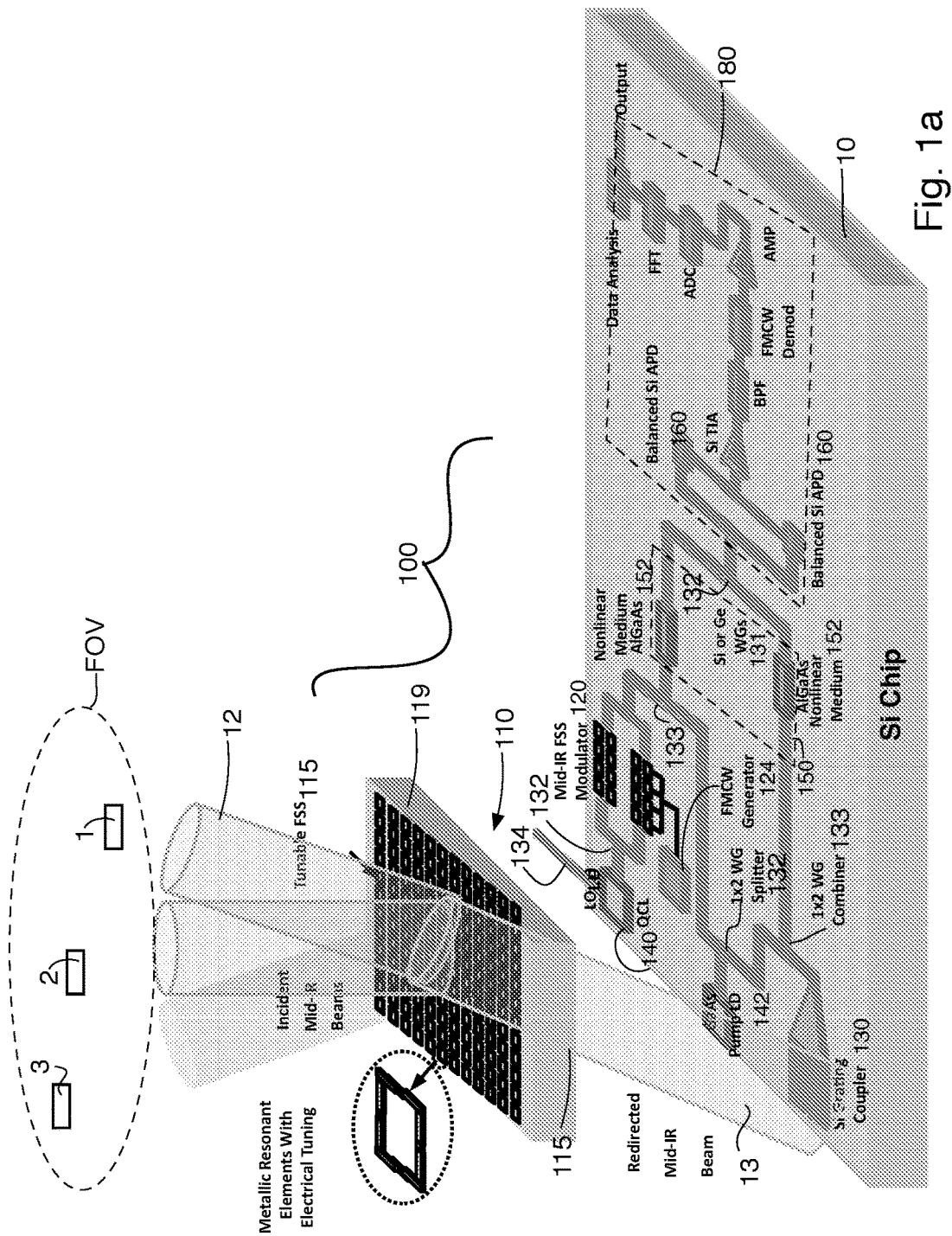
FIG. 1a is a schematic drawing of the novel chip-scale IR coherent LADAR receiver concept disclosed herein with electronic beam scanning capability and an on board FMCW generator and associated modulator.
Figure 1B:
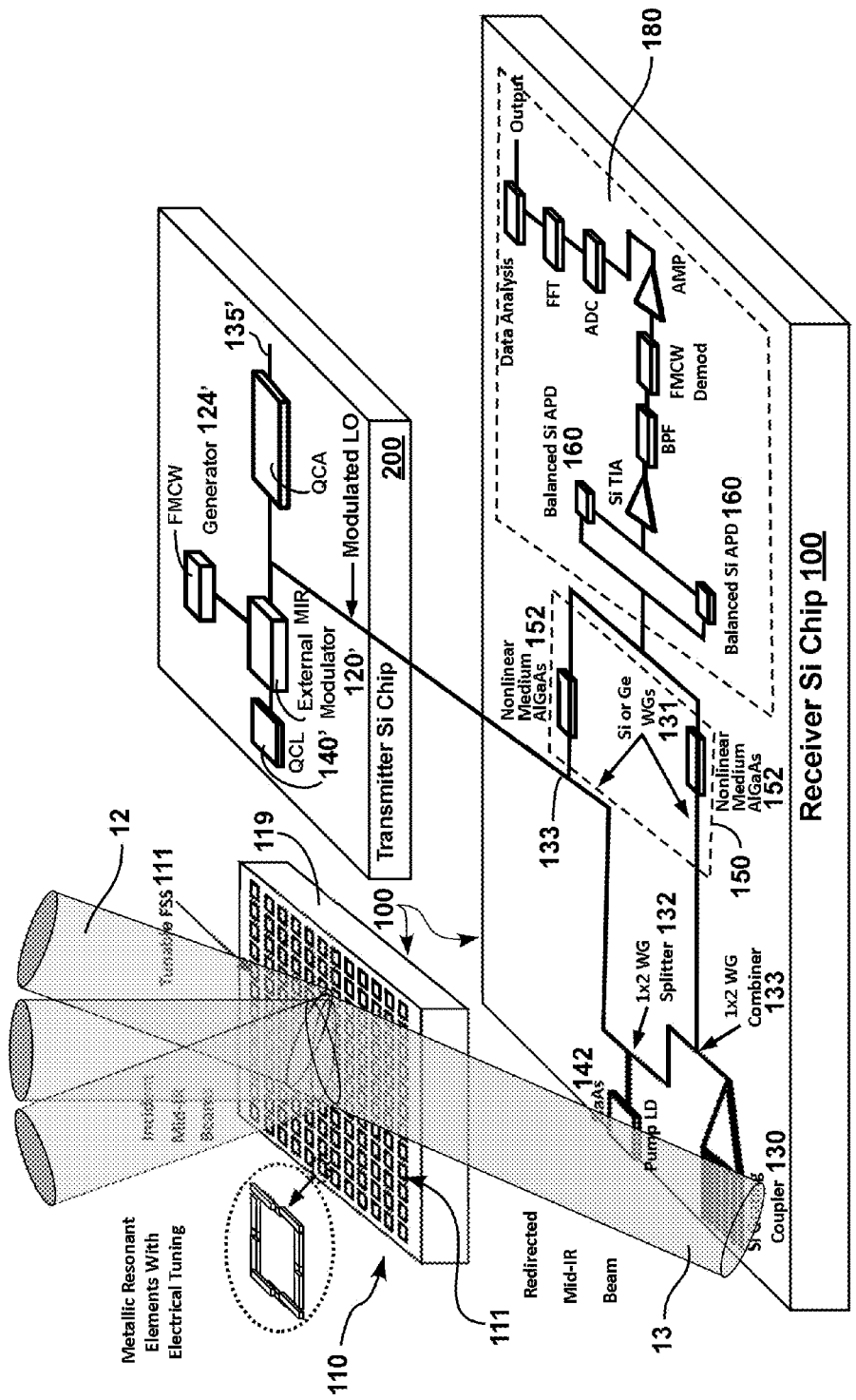
FIG. 1b is a schematic drawing of the novel chip-scale IR coherent LADAR receiver concept disclosed herein with electronic beam scanning capability and an off board FMCW generator and associated modulator.

Schematic diagrams of two slightly different embodiments of the chip-scale mid-IR coherent LADAR receiver 100 of the present invention with electronic beam scanning and frequency modulation signal processing capabilities are shown in FIGS. 1a and 1b. The embodiment of FIG. 1a has six main components (many of which are preferably integrated together on a common substrate (preferably as an optical integrated circuit chip)): (i) an electronically controlled IR optical beam scanner 110, (ii) a IR optical modulator 120, (iii) a grating coupler 130, (iv) a local oscillator laser 140 (which is preferably locked to a local oscillator in the transmitter via an optical path 134), (v) an optical, frequency upconverter 150, (vi) balanced photodiodes 160, (vii) a network of low loss integrated optical waveguides 131, splitters 132 and combiners 133, and (viii) a frequency modulated signal processing unit 180.

The optical chip for both embodiments can be implemented using Si-based semiconductor technologies, although III-V semiconductors technologies such GaAs or InP can also be used as the chip substrate for the receiver 100. In the embodiment of FIG. 1b the optical modulator 120 is not disposed on the integrated circuit chip of receiver 100 but rather a small amount (a sample, preferably less than 5%) of the output of an optical modulator 120' associated with the LADAR transmitter 200 is utilized instead in the receiver, which is communicated from a (or the) chip of the transmitter 200 via an optical path 134'. In the embodiment of FIG. 1b the optical modulator 120' of the LADAR transmitter 200 is effectively shared with the receiver 100 although only a small amount of the output of the optical modulator 120' associated with the LADAR transmitter 200 is needed by the receiver 100 in order to achieve coherent detection. So in the embodiment of FIG. 1b the LO (local oscillator) signal is extracted from the modulated QCL laser140' in the transmitter 200, using a sample (typically <5%) of its output power. The modulated transmit signal is also typically amplified for even a higher output power, using, for example, a quantum cascade amplifier (QCA). The transmitter's output port is labeled 135' in FIG. 1b.

As mentioned above, FIGS. 1a and 1b show two embodiments of the chip-scale LADAR receiver 100. Each embodiment relies on coherent detection of a received optical beam 12 which is reflected off some object (see the objects represented by boxes 1, 2, 3 on FIG. 1a) to be detected and which reflected beam was originally transmitted by the LADAR transmitter 100—not shown in detail—but a portion of the transmitter is shown by the chip labeled 200 in FIG. 1b. In coherent detection the received optical beam 13 is compared with the transmitted beam (or a replica of the transmitted beam). In the embodiment of FIG. 1a the aforementioned comparison is made with a replica of the transmitted beam while in the embodiment of FIG. 1b the aforementioned comparison is made with the sample of the transmitted beam (as outputted by modulator 120') and therefore the embodiment of FIG. 1b does not need an on-chip a IR optical modulator 120 since an off-chip modulator 120', associated with the LADAR transmitter 135, is utilized instead.

One of the important components of the chip-scale LADAR receiver 100 as disclosed herein is the electronically controlled beam scanner 110. The electronically controlled beam scanner 110 redirects a received optical beam or signals 12 an as outputted beam 13 at some fixed angle relative to the grating coupler 130. One of the received (or incoming) beams 12 (three are shown in the embodiments of FIGS. 1a and 1b for ease of illustration—there many be more of or fewer such beams 12) is selected for transmission (in the case of the embodiments of FIGS. 1a and 1b) or reflection (in the case of the embodiment of the electronically controlled beam scanner 110 of FIG. 1c). The beams 12 are typically a reflected LADAR signal (originally transmitted by transmitter 135 to illuminate one or more objects 1, 2, 3 to be detected), which is a reflection and/or scattering off the one or more objects 1, 2, 3 be detected by a LADAR transmitted FMCW signal). The beams 12 are incident on the electronically controlled optical beam scanner 110 of the LADAR receiver 100 within the field-of-view FOV of the beam scanner 110 and then redirected to a grating coupler 130 (preferably disposed below it on chip 10) and preferably at a fixed angle relative thereto, as shown in FIGS. 1a and 1b. The redirection of the received optical beams or signals 12 at a fixed angle to the grating coupler 130 optimizes its coupling efficiency to optical waveguides on the chip for further processing. Another feature of the beam scanner 110 is that it can determine the angle of arrival of the LADAR received beams or signals 12.

The disclosed IR LADAR receiver 100 is described herein as being chip-scale. The reason for doing so is that it may be largely embodied using semiconductor substrates which are modified to include the electrical and optical components shown in FIGS. 1a and/or 1b using standard manufacturing techniques to form same. The electronically controlled beam scanner 110 is depicted as being spaced from substrate 10, but its bottom surface in the embodiments of FIGS. 1a and 1b might be separated from the coupler 130 on substrate 10 by only a small distance, typically less than one cm and perhaps only a mm or so. So the electronically controlled beam scanner 110 is preferably supported by (and bonded to) substrate 10 with that spacing kept in mind, unless of course, the light reflective embodiment for the electronically controlled beam scanner 110 of FIG. 1c is utilized instead, in which case the spacing between the substrate of he electronically controlled beam scanner 110 and substrate 10 would necessarily be greater.

One embodiment of the electronically controlled beam scanner 110 is a tunable frequency selective surface (FSS) 111, as shown in FIGS. 1a and 1b, which operates an an IR light transmissive mode. That is the IR light from the FSS is directed to a grating coupler 130 formed on substrate 10 after passing through the substrate 119 on which the FSS 111 is formed. Alternatively, the light can be reflected off the surface of the FSS 111 before being directed to the grating coupler 130. This alternative embodiment is shown in FIG. 1c. The reflective embodiment of the FSS 155 of FIG. 1c differs from the light transmissive FSS embodiments of FIGS. 1a and 1b in that (i) the FSS includes a reflective layer 118 (preferably formed by a layer of Au) and (ii) by the fact that an external mirror 14 will typically needed to be utilized in order for the incoming beams 12 to reach the IR light sensitive surface of the FSS 111. Since there needs to be room for the light from mirror 14 to reach the light sensitive surface of the FSS 155, in the embodiment of FIG. 1c the FSS 155 will typically be more widely spaced from substrate 10 than it is in the embodiments of FIGS. 1a and 1b.

Figure 2:
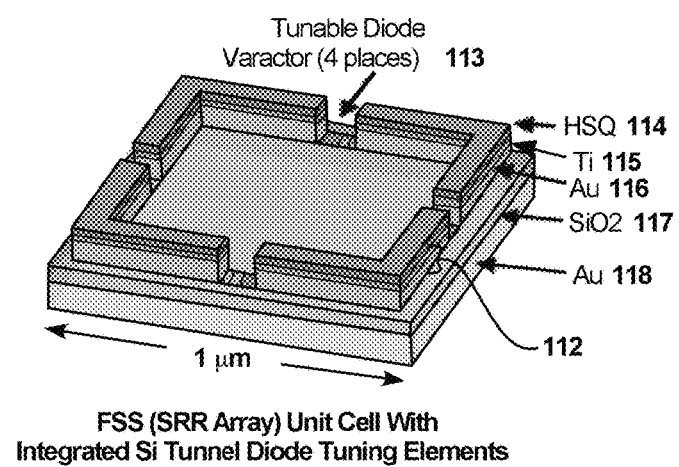
FIG. 2 is a schematic drawing of an embodiment of the electronically controlled mid-IR optical beam scanner using a tunable Frequency Selective Surface (FSS) structure consisting of an array of Split Ring Resonators (SRRs) preferably of integrated varactor design. Also shown, is a simulated phase change of a reflective SRR-based FSS optical beam scanner as a function of the varactor capacitance.

The FSS 111 is preferably formed by a two dimensional array of split rings 112 one of which is shown in greater detail in FIG. 2 and in still greater detail in the above-identified U.S. patent application Ser. No. 13/754,140. The FSS 111 preferably comprises a periodic array of metallic resonant elements or cells 112 integrated with a plurality of voltage tunable impedance structures 113 for each element or cell 112 and disposed on an electrically insulating and preferably IR transmissive (at the IR frequencies utilized) layer or substrate 117 such as $SiO_2$. The $SiO_2$ may in turn be disposed on a layer or substrate of semiconductor material 119 preferably transmissive to IR (for the light transmissive embodiment) such as Si especially when the reflective layer 118 is omitted from the electronically controlled beam scanner 110 such as in the case of the light transmissive embodiments of the electronically controlled beam scanner 110 utilized in receiver 100 embodiments of FIGS. 1a and 1b.

Figure 1C:
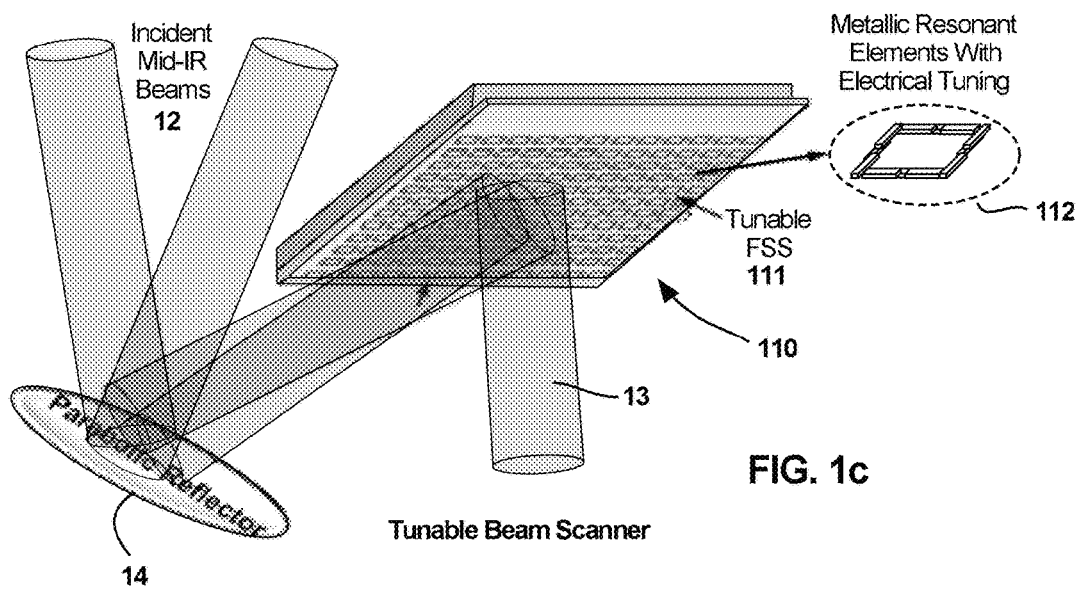
FIG. 1c depicts an alternative design of the electronically controlled beam scanner (compared to the electronically controlled beam scanner depicted in FIGS. 1a and 1b) where the electronically controlled beam scanner operates in a light reflective mode rather than a light transmissive mode.

FIG. 1c shows an embodiment of the tunable FSS 111 beam scanner 110 operated in a light reflective mode and therefor it includes a reflective layer 118 preferably formed of Au as mentioned above. For the transmissive embodiment of the FSS 111 beam scanner 110, the reflective layer 118 is omitted. The reflective and transmissive embodiments of the FSS 111 each include a 2D periodic array of metallic split ring resonators (SRR) unit cells 112 with a tunable capacitor 114 placed in gaps in the sides of the preferably square shaped SRRs 112. The tunable capacitors 114 are preferably implemented by tunnel diode varactors or using an alternative tunable device as taught by U.S. patent application Ser. No. 13/754,140 referenced above. The tunable capacitors 114 are controlled by electronics preferably disposed on the Si layer of substrate associated with the FSS beam scanner 110 to scan the Field of View FOW of the LADAR system for incoming LADAR signals reflected by (or scattered by) objects 1, 2, 3 which the LADAR system (with which the disclosed LADAR receiver it utilized) is intended to detect.

The metallic split ring resonators (SRR) unit cells 112 preferably are formed of (i) a layer 116 of Au disposed on the aforementioned layer 117 of $SiO_2$, (ii) a layer 115 of Ti formed on layer 116 and a layer 114 of hydrogen silsesquioxane (HSQ) formed on layer 115 as taught in greater detail by U.S. patent application Ser. No. 13/754,140 referenced above.

Figure 2A:
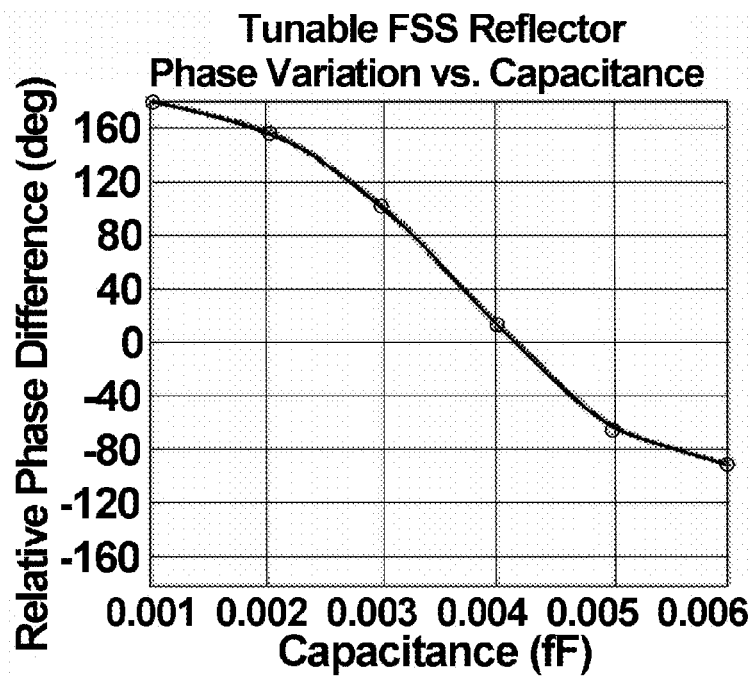
FIG. 2a is graph of a simulated phase change imparted on a mid-IR optical beam reflected from the FSS as a function of the capacitance of the varactors.
Figure 2B:
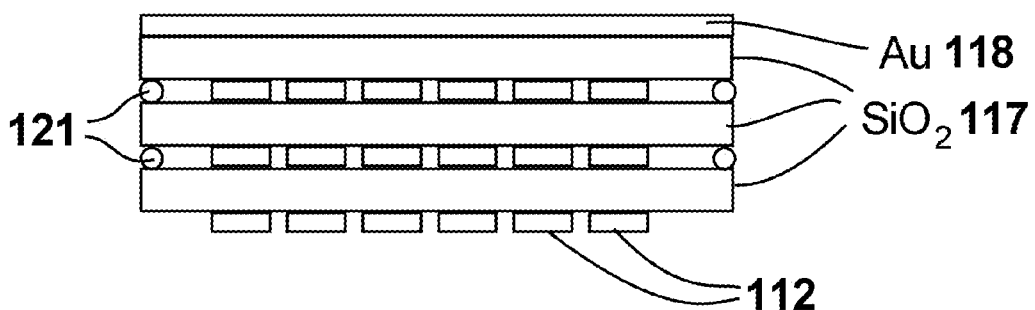
FIG. 2b shows a stacked array of FSSs.

FIG. 2a shows a graph of a simulated phase change imparted on a mid-IR optical beam reflected from FSS 111 as a function of the capacitance of the varactors 112. Multiple FSS structures 111 can be stacked in order to obtain a larger phase change (see the embodiment of FIG. 2b) where each FSS 111 in that embodiment preferably has a Si substrate (not shown) covered by an insulator 117 such as $SiO_2$ with for supporting a 2D array of metallic split ring resonators (SRR) unit cells 112 with a tunable capacitor 114 placed in gaps between the SRRs 112, but in this embodiment a single metallic substrate 118 (preferably formed of Au) is provided for all of the FSS structures 111 of this stacked embodiment when used in a reflective mode (if a light transmissive mode FSS 15 is utilized then the light reflective layer is of course omitted). By employing multiple FSS structures 111 in a stacked arrangement, a larger beam 12 scanning angle can be obtained. The layers in this stacked arrangement may be bonded together at the peripheries by bonds 121. Substrate 119 is not shown in FIGS. 2 and 2b for ease of illustration Only a relatively small number of metallic split ring resonators (SRR) unit cells 112 are shown for each FSS 111 in the embodiments of FIGS. 1a-1c, it being understood that numbers of metallic split ring resonators (SRR) unit cells 112 forming the 2D arrays of same of a FSS 111 may be far greater than that depicted.

Another approach for tuning the FSS beam scanner 110 is to integrate nano-electro-mechanical (NEMs) cantilevers in the FSS unit cell structure 112 as taught by U.S. patent application Ser. No. 13/754,140 referenced above. Moving the cantilevers in a vertical or horizontal direction will result in a change in the effective capacitance and/or inductance of the FSS unit cell structure 112 and hence phase tuning.

Figure 3A:
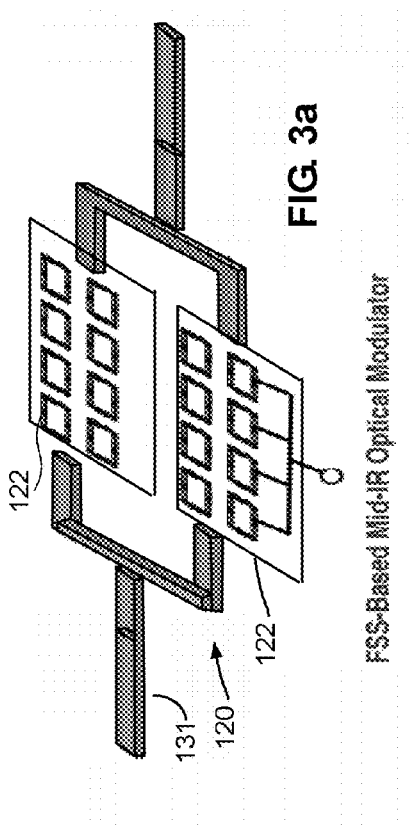
FIG. 3a depicts the structure of the tunable-FSS based mid-IR Mach-Zender optical modulator. Also shown is the dispersion characteristics and optical loss of the FSS structure as a function of the tuning integrated varactor.
Figure 3B:
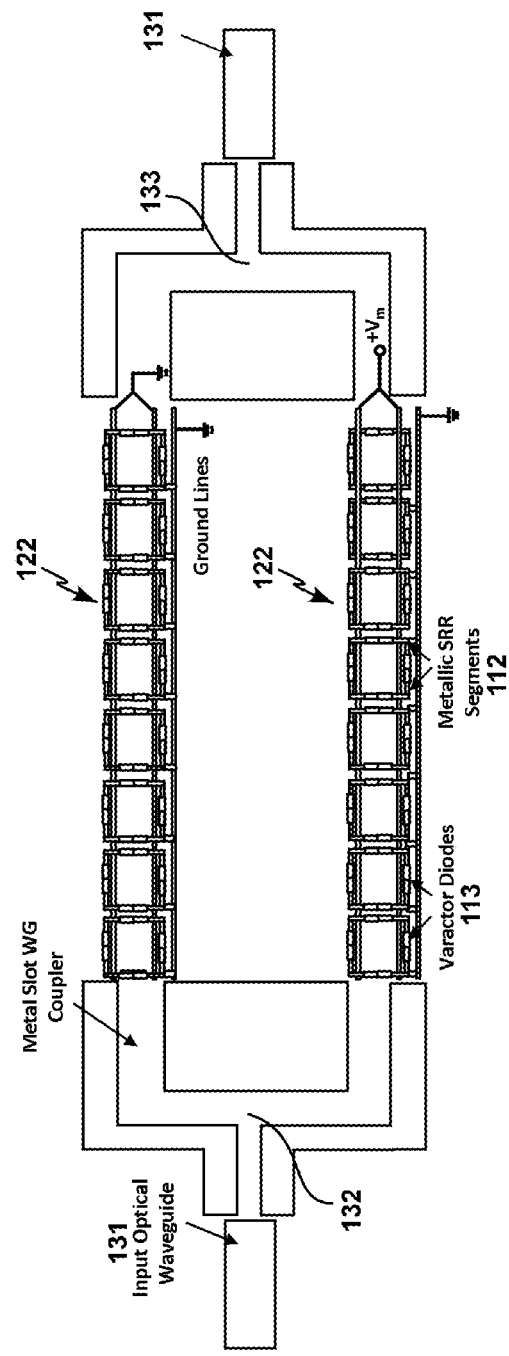
FIG. 3b depicts how the on board FMCW modulator is connected to varactors in the split rings of the FSS in one leg of the Mach-Zehnder modulator and how the split rings of the FSS in the other leg of the Mach-Zehnder modulator are grounded.
Figure 3C:
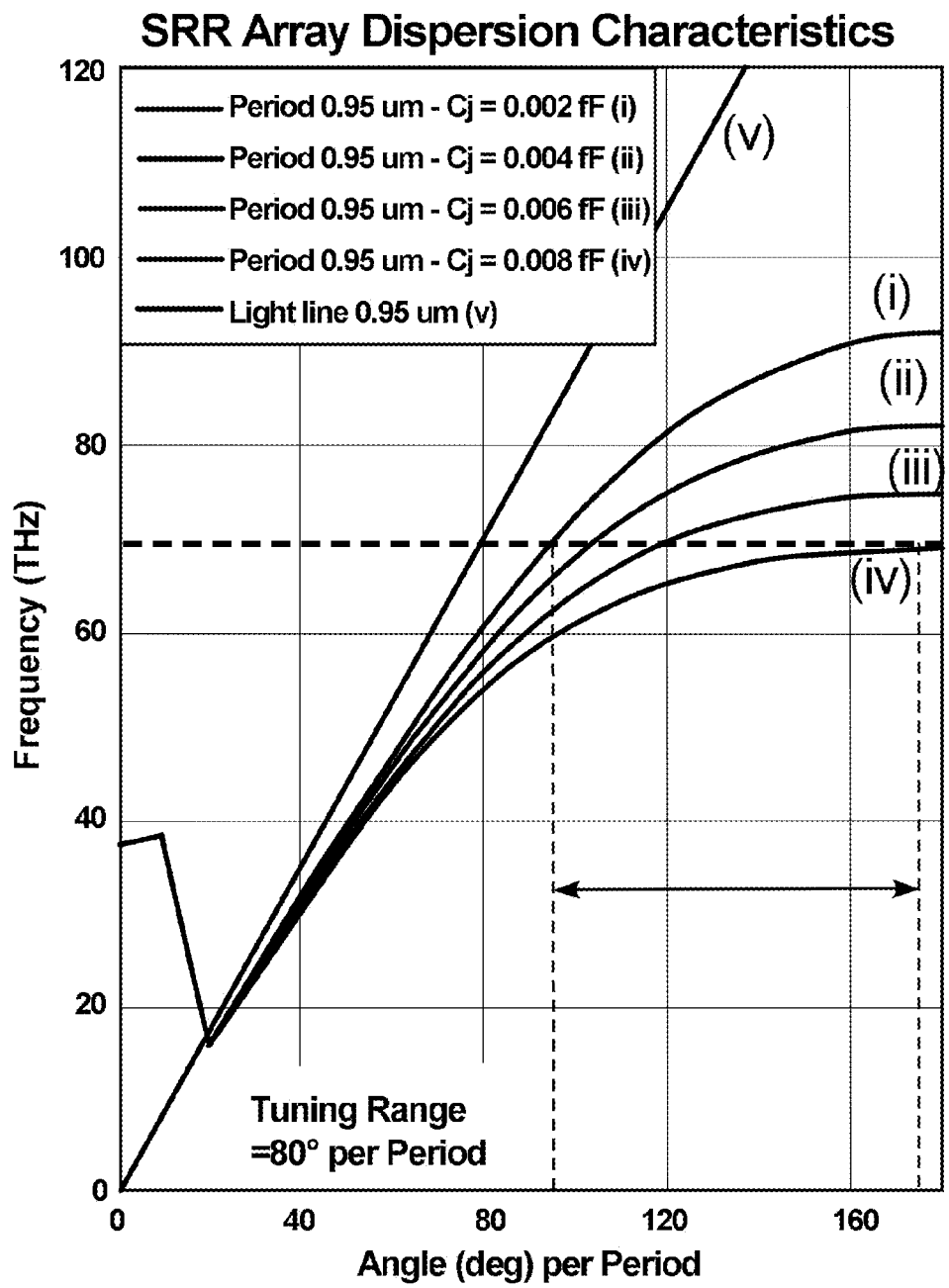
FIG. 3c is a graph of the simulated dispersion characteristics and FIG. 3d shows the simulated optical loss spectra of a tunable SRR-based FSS structure operated in the surface wave mode.
Figure 3D:
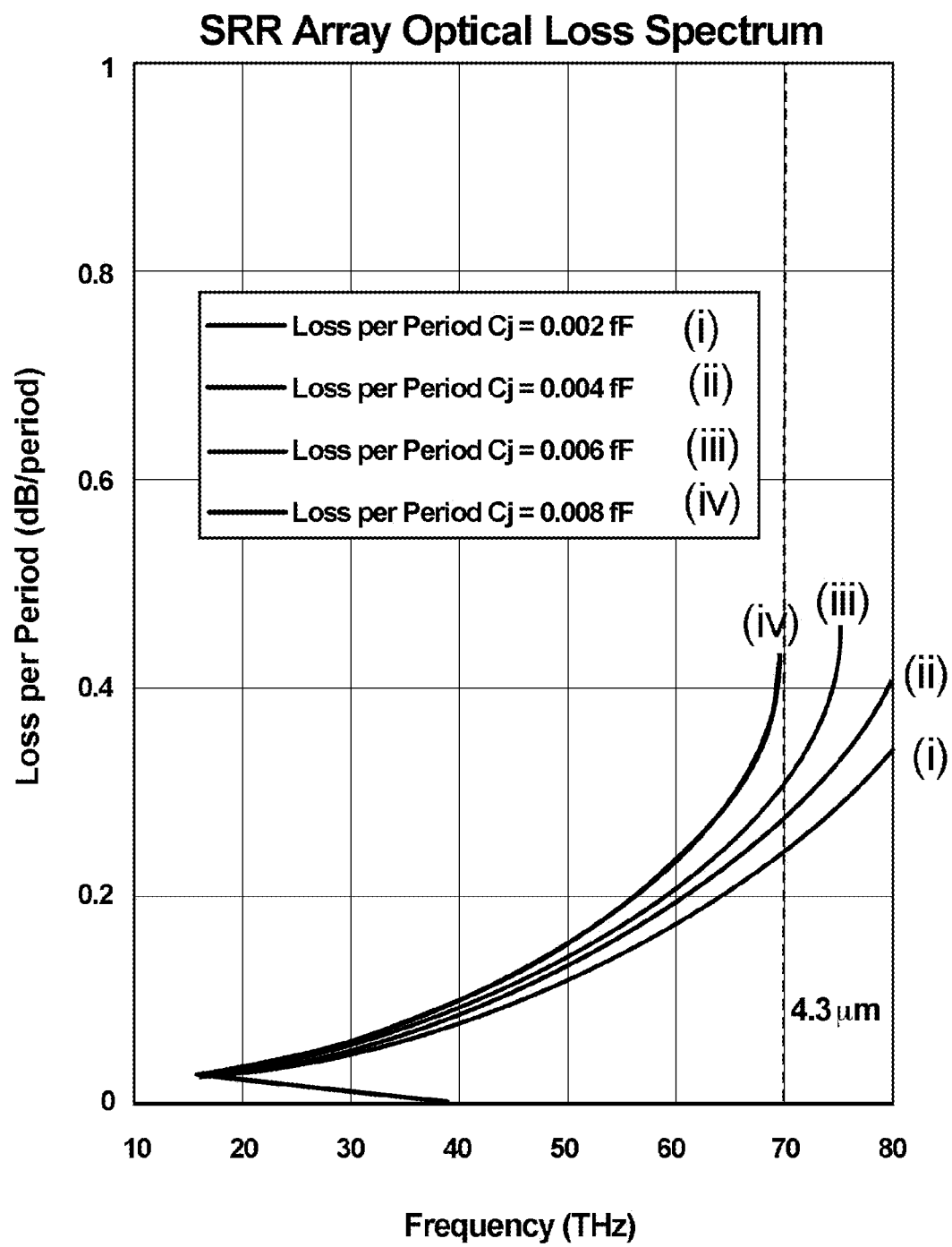
Figure 3F:
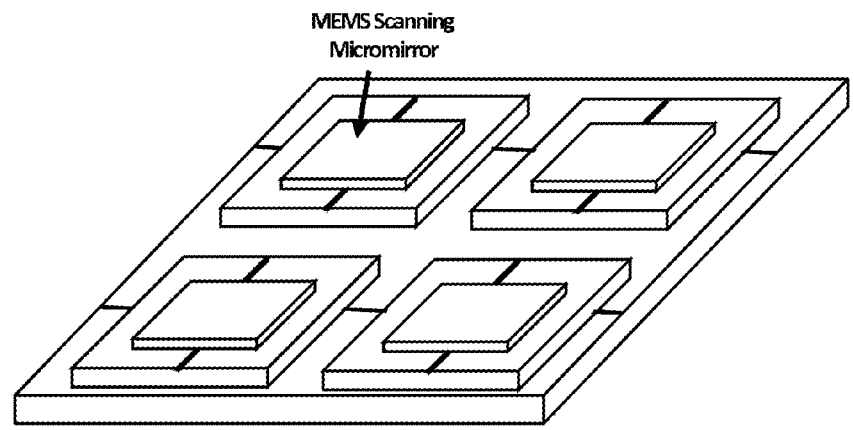
FIG. 3f depicts an optional scanner design based on an array of scanning MEMS micromirrors.

Yet another possible embodiment for the mid-IR optical beam scanner 110 is a 2-D scanning micro-mirror structure having a plurality of small mirrors whose angles are preferably individually controlled using MEMS devices such as that shown in FIG. 3f. A disadvantage of the micro-mirror scanning approach is that the scanning speed is slower due to the needed mechanical motion of the micro-mirrors, and potentially another disadvantage is smaller deflection angles.

Turning again to the embodiments of FIGS. 1a and 1b, a grating coupler 130, such as one constructed from Si (for example), couples the incoming mid-IR optical signal from the FSS 111 that is to be detected to a low loss (preferably <1 dB/cm) Si-based mid-IR photonic waveguide 131 with high efficiency (preferably >90%). The mid-IR photonic waveguide 131 is preferably realized on a silicon-on-insulator (SOI) substrate 10 using either a Si photonic waveguide with an underlying air bridge to eliminate optical losses in the underlying $SiO_2$ layer for wavelengths above 3 μm, or a Ge photonic waveguide on Si whose losses are below 1 dB/cm. The use of an SOI substrate 10 is preferred as it allows the realization of these low loss mid-IR waveguiding structures.

An IR optical modulator 120 is another important element of the chip-scale IR frequency modulated LADAR receiver embodiment of FIG. 1a. A preferred embodiment of this IR optical modulator 120 is shown in FIG. 3a while the electrical connections to the FMCW Generator are shown in greater detail in FIG. 3b.

It should perhaps be recalled that two embodiments of the receiver are shown by FIGS. 1a and 1b. In the embodiment of FIG. 1a the IR an optical modulator 120 is on board the receiver chip 10 (it being understood of course that addition that an optical modulator would also be associated with the transmitter of the LADAR system) while in the embodiment of FIG. 1b the IR optical modulator 120' is associated with the transmitter and therefor a separate modulator in the receiver is not needed. When the optical modulator 120 is on board the receiver it needs to mimic the optical modulator 120' in the transmitter for coherent detection to work properly. So in addition to having optical modulator 120 on board the chip in the embodiment of FIG. 1a, a laser source 140, and a FMCW Generator 124 are also shown preferably on board the receiver chip 10 and they would mimic similar components of the transmitter (see the laser source 140' and FMCW Generator 124' in block 135 on FIG. 1b).

It should also be understood that when consideration is given to mimicking the optical modulator 120', the laser source 140' and the FMCW Generator 124' of the transmitter on the receiver chip 10, one does not necessarily need to mimic all of them. For example, instead of mimicking the unmodulated laser of the transmitter by laser source 140', the source could instead be a sampled portion of the laser of the transmitter (before the laser is modulated at the transmitter). Similarly, the FMCW Generator 124 on the receiver chip 10 (which mimics the FMCW Generator 124' associated with the transmitter of the LADAR system) may be replaced with a signal from the FMCW Generator 124' associated with the transmitter.

The IR optical modulator 120 shown in FIGS. 3a and 3b includes a pair of FSS structures 122 which support surface waves which are arranged in a Mach-Zehnder configuration. The IR light is coupled from the IR waveguides 131 to the tunable FSS structures 122 of the optical modulator 120 which is preferably arranged in a Mach-Zehnder configuration. The tuning of the FSS structures 122 in the modulator 120 can be obtained preferably using the varactor approach as discussed above and thus FSS structures 122 of the modulator are preferably of the same basic design of the FSS 111 described above with reference to FIG. 2, although only two opposing varactors are needed when a pair of FSS 122 is used in the modulator embodiment of FIGS. 3a and 3b.

FIG. 3c is a graph of the simulated dispersion characteristics and FIG. 3c shows the simulated optical loss spectra of a tunable SRR-based FSS 111 structure operated in a surface wave mode. Simulation results indicate that the tunable FSS based mid-IR optical modulator can be as small as 4 μm in the propagation direction (with 2-4 μm in the lateral direction) due to the large effective index change achievable with this structure. The small size and low optical propagation loss (<2 dB) of this mid-IR optical modulator implementation is advantageous for its integration into the chip-scale mid-IR LADAR receiver disclosed herein.

Another embodiment (see FIG. 3e) for the mid-IR optical modulator 120 is a Mach-Zehnder configuration consisting of two Si based mid-IR optical waveguides, in which the phase of one of the waveguiding arms (the lower arm as depicted in FIG. 3e) is modulated via a carrier-injection mechanism. The p-Si and n-Si regions of this embodiment of the optical modulator 120 (which is known per se in the prior art), form a pn junction-based optical modulator which can operate in two modes: (i) a charge injection mode wherein the pn junction is forward biased in order to inject electrons and holes from the n and p sides of the junction respectively, thus changing the steady-state charge density, and hence the optical index of refraction for the propagating optical mode, and (ii) a charge depletion mode wherein the pn junction is reverse biased in order to deplete both the electrons and holes in the vicinity of the junction, again resulting in a net change in the charge density, and hence the optical index of refraction for the propagating optical mode. This embodiment of the IR optical modulator 120 will be longer (a few millimeters in length) than the FSS-based approach described above, but should be simpler to fabricate.

In either implementation of the mid-IR optical modulator 120, a frequency modulated electrical signal ($V_m$), preferably identical to the one in a transmitter analog of this receiver disclosed herein, is applied to the modulator 120 preferably by the FMCW generator 124 in order to obtain a corresponding frequency modulated optical signal at the output of the modulator 120. A linear FMCW signal generated by the on chip FMCW generator 124 (see FIG. 1a) is one example of the frequency modulated signal used to modulate the IR optical modulator 120.

The optical local oscillator (LO) 140 for coherent detection is preferably embodied as a quantum-cascade mid-IR semiconductor laser (QCL) based on III-V semiconductors such as GaAs or InP substrates in the embodiment of FIGS. 1a and 1b. The layer of the QCL device 140 are preferably monolithically integrated with the main SOI chip 10 that the coherent LADAR receiver is based on using conventional semiconductor wafer bonding techniques. The QCL 140 can provide local oscillator optical beams in the 3-12 μm wavelength range, compatible with the IR optical detection signal. The output of the QCL 140 is coupled to low-loss Si photonic waveguides 131, as shown in FIG. 1 and hence to the modulator 120 via a splitter 132. In the embodiment of FIG. 1b the master laser of the transmitter 140' is sampled and a very small portion of that signal is used instead of mimicking that signal by the QCL laser 140 mentioned above.

The outputs of the photonic waveguides 131 carrying the IR signal beam (from grating coupler 130) and LO optical beams (after modulation by, for example, modulator 120) are coupled via a combiner 133 to two semiconducting regions 152 (which form the frequency upconverters 150 with high second order optical nonlinearity).

Second order nonlinearity is one of the properties of nonlinear optical material that is used for optical frequency conversion such as in second harmonic or sum-frequency generation. III-V semiconductors, such as GaAs and related compounds (e.g. AlGaAs), have a high second order nonlinearity (~100 pm/V), which is preferably utilized by upconvertors 150. The fabrication of such nonlinear elements for frequency conversion is explained in "Continuous-wave sum-frequency generation in AlGaAs Bragg reflection waveguides", Optics Letters, Vol. 34, p. 3656, 2009.

These optical nonlinear regions 152 preferably consist of GaAs or InP semiconductor compound layers, which are bonded to the Si substrate 10 preferably as part of the overall semiconductor layers also containing the QCL device 140 (if an onboard embodiment thereof is used), described above. Related compounds of GaAs, such as AlGaAs can be used as the nonlinear element depending on the wavelength of the frequency converted signal. In the disclosed embodiment, the converted signal preferably has a wavelength of 805 nm which is absorptive in GaAs, hence AlGaAs is used instead for the upconvertors 150 due to its transparency at this wavelength. Both the signal and the LO optical beams are preferably mixed with an optical beam generated by a high power pump laser 142 (see FIGS. 1a and 1b) operating at higher frequencies (preferably corresponding to near-IR wavelengths and preferably at 980 nm) in the two nonlinear optical regions 152, as shown in FIGS. 1a and 1b. The mixing of the signal/LO beams and the higher frequency pump beam from laser 142 in the nonlinear material of regions 152 of upconvertor 150 results in sum-frequency generation (SFG) process which upconverts both the signal and LO beams to higher frequencies given by the formula below:

$$f_{SF} = f_S + f_P \text{ or } \lambda_{SF} = \frac{\lambda_P \lambda_S}{\lambda_P + \lambda_S},$$

where $f_{SF}(\lambda_{SF})$ are the sum-frequency (wavelength), and $f_S(\lambda_S)$ and $f_P(\lambda_P)$ are the signal/LO and pump frequencies (wavelengths), respectively. For example, a pump laser with a wavelength of 980 nm will upconvert a 4500 nm mid-IR signal/LO beam to a near-IR wavelength of about 805 nm. The upconversion process is given by the following relationship:

$$P_{SF} = P_P P_S \nu \kappa^2 L^2 \frac{\sin^2\left(\frac{\Delta k L}{2}\right) + \sinh^2\left(\frac{(-\alpha_{SF} + \alpha_P + \alpha_S)L}{4}\right)}{\left(\frac{\Delta k L}{2}\right)^2 + \left[\frac{(-\alpha_{SF} + \alpha_P + \alpha_S)L}{4}\right]^2} e^{-\frac{(\alpha_{SF} + \alpha_P + \alpha_S)L}{2}}$$

-continued $$\kappa = \sqrt{\frac{8\pi^2 \eta_{NL}^2}{n_{SP} n_P n_S c \varepsilon_0 \lambda_{SP}^2}}$$

where, $P_i$(i=SF,P,S), $\lambda_i$(i=SF,P,S), $\alpha_i$(i=SF,P,S), and $n_i$(i=SF,P,S) are the optical power levels, wavelengths, optical losses, and optical indices of the sum-frequency (SF), pump (P) and signal (S) optical power levels, respectively, $\Delta k = k_{SF} - k_P - k_S$ is the phase mismatch, $\eta_{NL}$ is the second order nonlinearity, L is the length of the nonlinear waveguide and $\upsilon$ is the optical frequency. As an example, a received optical signal at a wavelength of 4500 nm and a power level of 350 μW at the input of a 3 mm long GaAs nonlinear region with a second-order nonlinearity of 100 pm/V will upconvert to an optical beam at a wavelength of 805 nm and a power level of about 35 μW using a pump signal with an optical power level of 500 mW at a wavelength of 980 nm. This translates into a frequency conversion efficiency of about 10%. The optical pump power is preferably provided by a high power near infrared distributed Bragg reflector (DBR) pump laser 142.

Figure 4:
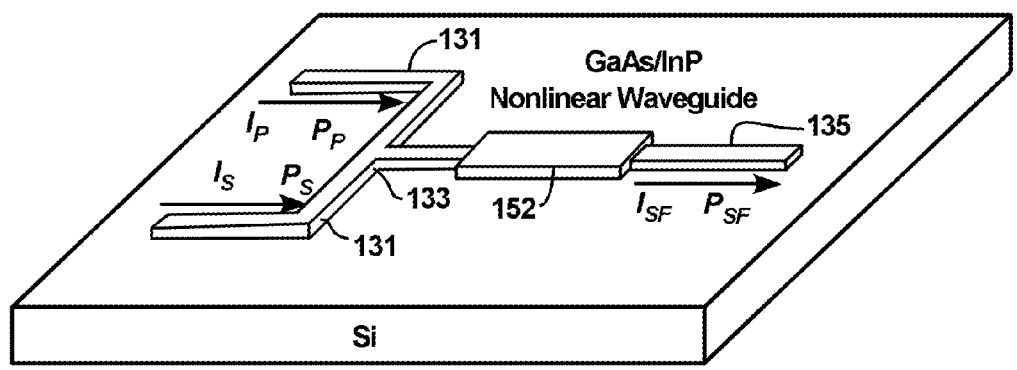
FIG. 4 is a schematic drawing of the sum-frequency-generation (SFG) components of the chip-scale coherent LADAR receiver.

FIG. 4 shows a schematic of the SFG components of one of the frequency upconvertors 150. There are two such upconvertors 150 in each of the embodiments of FIGS. 1a and 1b and each upconvertor 150 has an associated input waveguide 131 in which either the output of the Si grating coupler 130, or that of the Mid-IR modulator 120 is combined (at a combiner 133) with the GaAs pump laser 142 to perform the optical frequency upconversion in the nonlinear waveguide element 152. The output waveguide 135 carrying the upconverted optical signals from the two upconvertors 150 are applied to a combiner 132 then thence to the frequency modulated signal processing unit 180.

The output waveguides 135 carrying the upconverted optical signals is preferably based on a III-V material, such as GaAs or InP, which is transparent to the wavelength of this signal. Again, the III-V semiconductor-based layers which form the output waveguides 135 are preferably part of an overall semiconducting layer structure bonded to the Si substrate 10, which also supports or contains the QCL 140 (if implemented on board) and SFG elements 152 of the device.

The final section of the receiver 100 preferably contains a pair of balanced photodiodes 160 which mix the upconverted received mid-IR optical signal and LO beams to thereby provide a coherently converted electrical signal. A single photodiode could be used instead at the expense of signal SNR. This coherent detection of the mid-IR optical signal results is an additional gain which is proportional to the optical power of the LO signal. The photodiode pairs 160 are preferably based on Si avalanche photodiodes (APDs), which are advantageous because of their high signal-to-noise ratio (SNR), as well as being compatible with the SOI substrate 10 utilized in a the preferred embodiment of the chip-scale mid-IR coherent LADAR receiver 100. The upconversion of both the mid-IR optical signal and the optical LO enables their mixing in Si-based APDs which can operate efficiently at room temperature. The outputs of the balanced photodiodes 160 are preferably fed into CMOS-based electronics 180 for post receiver processing of the coherently detected mid-IR signal.

For frequency modulated LADAR signals, post processing electronics 180 are coupled to the output of the LADAR receiver 100 and preferably includes a bandpass filter (BPF) 181, a frequency (FMCW) demodulator 182, amplifiers, an analog-to-digital (ADC) converter 183, fast Fourier transformer (FFT) 184, and data analysis processors 185. The FMCW demodulator 182 is also connected to the FMCW generator whether or not the FMCW generator of the transmitter is mimicked on board chip 10 as FMCW generator 124 (as in the embodiment of FIG. 1a) or the FMCW generator 124' of the transmitter is utilized directly (as in the embodiment of FIG. 1b). The post detection LADAR electronic processing provided by post processing electronics 180 may be conventional and therefore does not need to be further described.

This concludes the description of embodiments of the present invention. The foregoing description of these embodiments and the methods described have been presented for the purposes of illustration and description. It is not intended to be exhaustive or to limit the invention to the precise forms or methods disclosed. Many modifications and variations are possible in light of the above teachings. It is intended that the scope of the invention be limited not by this detailed description, but rather by the claims appended hereto.

What is claimed is:

1. A coherent frequency modulated receiver for receiving and detecting optical signals, the receiver comprising;
   a. an electrically controllable optical beam scanner receiving optical signals arriving at different angles in a field of view of said electrically controllable optical beam scanner, said electrically controllable optical beam scanner conveying a scanned optical input beam as an output or reflected optical beam;
   b. a grating coupler responsive to the output or reflected optical beam of said electrically controllable optical beam scanner, said grating coupler having a waveguided output;
   c. an optical local oscillator laser having a waveguided output;
   d. a FMCW signal generator;
   e. an optical modulator responsive to the optical waveguided outputs of the optical local oscillator laser and also to an electrical FMCW signal from the FMCW signal generator; and
   f. a pair of second order non-linear optical elements for frequency upconverting respective outputs of the optical modulator and the grating coupler.

2. The coherent frequency modulated receiver of claim 1 further including a pump laser the output of which is mixed (i) with the output of the optical modulator before application to a first one of said pair of second order non-linear optical elements and (ii) with the waveguided output of the grating coupler before application to a second one of said pair of second order non-linear optical elements.

3. The coherent frequency modulated receiver of claim 1 wherein the electrically controllable optical beam scanner includes a two dimensional array of split ring resonators.

4. The coherent frequency modulated receiver of claim 3 wherein each split ring resonator in said array of split ring resonators has a square shape with a gap in each of the four sides of the square shape, each gap thereof being occupied by a varactor.

5. The coherent frequency modulated receiver of claim 1 wherein the electrically controllable optical beam scanner includes a two dimensional array of scanning micromirror structures.

6. The coherent frequency modulated receiver of claim 1 wherein the grating coupler, the optical modulator and the pair of second order non-linear optical elements are all disposed on a common substrate.

7. The coherent frequency modulated receiver of claim 6 further including frequency modulated signal processing circuits coupled to the outputs of said pair of second order non-linear optical elements and disposed on said common substrate.

8. The coherent frequency modulated receiver of claim 7 wherein the frequency modulated signal processing circuits include a pair of avalanche photodiodes coupled to the outputs of said pair of second order non-linear optical elements.

9. The coherent frequency modulated receiver of claim 1 wherein the optical modulator is a shared device which also resides in an optical transmitter associated with said coherent frequency modulated receiver.

10. A coherent frequency modulated LADAR for emitting and detecting reflected optical signals, the LADAR comprising;
    a. an electrically controllable optical beam scanner receiving optical input beams arriving at different angles in a field of view of said electrically controllable optical beam scanner, said electrically controllable optical beam scanner conveying a scanned optical input beam as an output or reflected optical beam;
    b. a grating coupler responsive to the output or reflected optical beam of said electrically controllable optical beam scanner, said grating coupler having a waveguided output;
    c. an optical local oscillator laser having a waveguided output;
    d. a FMCW signal generator;
    e. an optical modulator responsive to the optical waveguided outputs of the optical local oscillator laser and also to an electrical FMCW signal from the FMCW signal generator; and
    f. a pair of second order non-linear optical elements for frequency upconverting respective outputs of the optical modulator and the grating coupler.

11. The coherent frequency modulated LADAR of claim 10 further including a pump laser the output of which is mixed (i) with the output of the optical modulator before application to a first one of said pair of second order non-linear optical elements and (ii) with the waveguided output of the grating coupler before application to a second one of said pair of second order non-linear optical elements.

12. The coherent frequency modulated LADAR of claim 10 wherein the electrically controllable optical beam scanner includes a two dimensional array of split ring resonators.

13. The coherent frequency modulated LADAR of claim 12 wherein each split ring resonator in said array of split ring resonators has a square shape with a gap in each of the four sides of the square shape, each gap thereof being occupied by a varactor.

14. The coherent frequency modulated LADAR of claim 10 wherein the electrically controllable optical beam scanner includes a two dimensional array of scanning micromirror structures.

15. The coherent frequency modulated LADAR of claim 10 wherein the grating coupler, the optical modulator and the pair of second order non-linear optical elements are all disposed on a common substrate.

16. The coherent frequency modulated LADAR of claim 15 further including frequency modulated signal processing circuits coupled to the outputs of said pair of second order non-linear optical elements and disposed on said common substrate.

17. The coherent frequency modulated LADAR of claim 16 wherein the frequency modulated signal processing circuits include a pair of avalanche photodiodes coupled to the outputs of said pair of second order non-linear optical elements.

18. The coherent frequency modulated LADAR of claim 10 wherein the optical modulator is a shared device which also resides in an optical transmitter associated with said coherent frequency modulated LADAR.

19. The coherent frequency modulated receiver of claim 1 wherein the electrically controllable optical beam scanner includes a frequency selective surface formed by a two dimensional array of electrically conductive elements disposed on a light transmissive surface.

20. A method of detecting optical signals comprising:
receiving optical input beams arriving at different angles in a field of view of an optical beam scanning device, the optical beam scanning device outputting or reflecting a scanned optical input beam as an output optical beam or as a reflected optical beam;
providing an optical grating responsive to the output optical beam or the reflected optical beam of the optical beam scanning device, the optical grating providing a waveguided output;
generating an optical local oscillator signal;
generating a modulated electrical signal;
modulating the optical local oscillator signal with the modulated electrical signal to generate a modulated optical local oscillator signal;
mixing the frequency modulated optical local oscillator signal and the waveguided output of the optical grating;
generating an electrical signal based on the results the mixing step.

21. The method of claim 20 wherein the modulated optical local oscillator signal and the waveguided output of the optical grating are upconverted using a pair of second order non-linear optical elements prior to the mixing step.

22. The method of claim 21 wherein the mixing step is performed using a pair of avalanche photodiodes, a first one of the pair of avalanche photodiodes being coupled to at least a first one of the second order non-linear optical elements and a second one of the pair of avalanche photodiodes being coupled to at least a second one of the second order non-linear optical elements.

23. The method of claim 20 wherein the mixing step is performed using at least one photodiode.

24. The method of claim 20 wherein the step of generating a modulated electrical signal generates a frequency modulated signal.

25. An apparatus for detecting optical signals comprising:
an optical beam scanner receiving optical input beams which arrive at different angles in a field of view of the optical beam scanner, the optical beam scanner outputting or reflecting a scanned optical input beam as an output optical beam or as a reflected optical beam;
an optical grating responsive to the output optical beam or the reflected optical beam of the optical beam scanner, the optical grating providing a waveguided output;
an optical local oscillator signal generator;
a modulator for modulating the optical local oscillator signal with a modulated electrical signal to generate a modulated optical local oscillator signal;
means for mixing the frequency modulated optical local oscillator signal and the waveguided output of the optical grating;
generating an electrical signal from the mixing means.

26. The apparatus of claim 25 wherein the modulated optical local oscillator signal and the waveguided output of the optical grating are upconverted using a pair of second order non-linear optical elements prior to applying those signals to said mixing means.

27. The apparatus of claim 26 wherein the mixing means includes a pair of avalanche photodiodes, a first one of the pair of avalanche photodiodes being coupled to at least a first one of the second order non-linear optical elements and a second one of the pair of avalanche photodiodes being coupled to at least a second one of the second order non-linear optical elements.

28. The apparatus of claim 25 wherein the mixing means includes at least one photodiode.

29. The apparatus of claim 25 wherein the modulated electrical signal is a frequency modulated electrical signal.

30. The method of claim 20 wherein the optical input beams comprises beams reflecting off or scattered by objects to be detected in a field of view of a laser radar system, the field of view of a laser radar system and the field of view of the optical beam scanning device being the same field of view.

31. The method of claim 20 wherein the optical beam scanner is a frequency selective surface.

32. The method of claim 31 wherein the frequency selective surface comprises a two dimensional array of resonant elements or cells, each resonant element or cell including at least one tunable impedance structure.

33. The method of claim 20 wherein the optical input beams arriving at different angles in the field of view of an optical beam scanning device comprise a plurality of distinct beams.

34. The apparatus of claim 25 wherein the optical input beams comprises beams reflecting off or scattered by objects to be detected in a field of view of a laser radar system, the field of view of a laser radar system and the field of view of the optical beam scanning device being the same field of view.

35. The apparatus of claim 25 wherein the optical beam scanner is a frequency selective surface.

36. The apparatus of claim 35 wherein the frequency selective surface comprises a two dimensional array of resonant elements or cells, each resonant element or cell including at least one tunable impedance structure.

37. The method of claim 25 wherein the optical input beams arriving at different angles in the field of view of an optical beam scanning device comprise a plurality of distinct beams.

* * * * *